United States Patent
Tanaka et al.

[11] Patent Number: 5,566,115
[45] Date of Patent: *Oct. 15, 1996

[54] SEMICONDUCTOR MEMORY DEVICE

[75] Inventors: Yasuhiro Tanaka; Tetsuya Tanabe, both of Tokyo, Japan

[73] Assignee: OKI Electric Industry Co., Ltd., Tokyo, Japan

[21] Appl. No.: 534,589

[22] Filed: Sep. 27, 1995

[*] Notice: The term of this patent shall not extend beyond the expiration date of Pat. No. 5,477,496.

Related U.S. Application Data

[62] Division of Ser. No. 371,536, Jan. 11, 1995, Pat. No. 5,477,496.

[30] Foreign Application Priority Data

Jan. 11, 1994 [JP] Japan ................................ 6-001299

[51] Int. Cl.⁶ ................................................ G11C 7/06
[52] U.S. Cl. .......................... 365/203; 369/190; 369/226; 369/202
[58] Field of Search .................................. 365/203, 202, 365/207, 226, 190

[56] References Cited

U.S. PATENT DOCUMENTS

| | | | |
|---|---|---|---|
| 4,494,221 | 1/1985 | Hardee et al. | 365/203 |
| 4,903,238 | 2/1990 | Miyatake et al. | 365/203 |
| 5,036,492 | 7/1991 | Runaldue | 365/203 |
| 5,091,889 | 2/1992 | Hamano et al. | 365/203 |
| 5,247,482 | 9/1993 | Kim | 365/203 |
| 5,325,335 | 6/1994 | Ang et al | 365/203 |
| 5,402,378 | 3/1995 | Min et al. | 365/202 |
| 5,477,496 | 12/1995 | Tanaka et al. | 365/203 |

FOREIGN PATENT DOCUMENTS

| | | |
|---|---|---|
| 442610 | 8/1991 | European Pat. Off. . |
| 58-035795 | 3/1983 | Japan . |
| 2250363 | 6/1992 | United Kingdom . |

*Primary Examiner*—Tan T. Nguyen
*Attorney, Agent, or Firm*—Spencer & Frank

[57] ABSTRACT

A semiconductor memory device includes first and second MOS transistors connecting a pair of data lines with a specific potential supplying node. A power transmitting circuit couples the specific potential supplying node with a power supply circuit of an equalizing potential after said first and second switching elements are made conductive. The power transmitting circuit isolates the specific potential supplying node from the power supply circuit when the equalization begins. As an alternative to the power transmitting circuit, a supplying circuit may be connected to supply a precharge potential to the specific potential supplying node when the equalization begins, and supply an equalizing potential to the specific potential supplying node when the switching elements are both turned on.

8 Claims, 6 Drawing Sheets

SEMICONDUCTOR MEMORY DEVICE

This is a Division of application Ser. No. 08/371,536 filed Jan. 11, 1995 now U.S. Pat. No. 5,477,496.

BACKGROUND OF THE INVENTION

The present invention relates to a semiconductor memory device of a high packing density, such as a dynamic random-access memory (hereinafter referred to as DRAM), and in particular to a precharge and equalization circuit for quickly bringing a pair of data lines to a fixed potential.

An example of conventional equalizing circuit is shown U.S. Pat. No. 5,036,492. The equalizing circuit is formed of two transistors provided between a pair of bit lines connected to a precharge circuit for supplying a predetermined potential. The two transistors have their sources connected respectively to the data lines their drains connected with each other, and their gates to which complementary equalizing signals are supplied. A bleeder current device is also connected to the drains. With such a configuration, the two transistors are concurrently activated, by means of the complementary equalizing signals, to set the bit lines at a same potential. The bleeder current device absorbs or supplies current so that the potentials on the bit lines do not depart from the set potential.

The above-described equalizing circuit requires a precharge circuit, and two control signals are required to control the precharge circuit and the equalizing circuit, so that the control over operation is complicated, and it is difficult to increase the overall operation speed of the device.

SUMMARY OF THE INVENTION

Accordingly, it is an object of the invention to simplify the control over operation and to increase the overall operation speed of the device.

According to a first aspect of the invention, there is provided a semiconductor memory device comprising:

a pair of data lines for transferring complementary signals;

an equalizing circuit having a first switching element connected between one of said pair of data lines and a specific potential supplying node, and a second switching element connected between the other of said pair of data lines and the specific potential supplying node, said first and second switching elements being made conductive in accordance with a control signal to electrically connect said pair of data lines with each other;

a power transmitting circuit connecting said specific potential supplying node with a power supply circuit of an equalizing potential after said first and second switching elements are made conductive;

said power transmitting circuit isolating said specific potential supplying node from said power supply circuit when one of said first and second switching elements becomes conductive and tile other of said first and second switching elements is not yet conductive.

The first and second switching elements of said equalizing circuit may comprise MOS transistors having their gate electrodes connected to receive said control signal.

With the above arrangement, the specific potential supplying node is isolated from the equalizing potential power supply circuit when one of the switching elements is conductive and the other switching element is not yet conductive, at the time when the equalization begins, i.e., when the control signal changes from the inactive state to the active state. As the potential of the control signal line varies (from the inactive state toward the active state) one of the switching elements (first switching element) connected to one of the data lines is turned on, so that the potential of the specific potential supplying node is varied toward the potential of the above-mentioned one of the data lines. When the potential of the control signal becomes sufficient, the switching element (second switching element) connected to the other data line is made conductive. It take less time for the potential of the control signal to become sufficient to turn on the second switching element because of the variation of the specific potential supplying node toward the above-mentioned one of the data lines, than if the specific potential supplying node is fixed at the equalizing potential. Thus, the two switching elements are made conductive in a shorter time, than if the specific potential supplying node is not isolated from the equalizing power supply circuit.

Assume that the switching elements are N-channel MOS transistors. As the potential of the control signal line rises (above a threshold of the MOS transistor) one of the MOS transistors (first MOS transistor) connected to one of the data lines which has transferred the signal of a lower potential level is made conductive to draw the charge from the specific potential supplying node, so that the potential of the specific potential supplying node is lowered. Because of the potential drop of the specific potential supplying node, the MOS transistor (second MOS transistor) connected to the data line having a higher potential is made conductive when the potential of the control signal becomes sufficient. The potential sufficient to turn on the second MOS transistor is the sum of the threshold of the transistor and the potential of the specific potential supplying node, which is lower than if the specific potential supplying node is fixed at the equalizing potential. Accordingly, the MOS transistors are made conductive in a shorter time, than if the specific potential supplying node is not isolated from the equalizing power supply circuit.

According to a second aspect of the invention, there is provided a semiconductor memory device comprising:

a pair of data lines for transferring complementary signals;

an equalizing circuit having a first switching element connected between one of said pair of data lines and a specific potential supplying node, and a second switching element connected between the other of said pair of data lines and the specific potential supplying node, said first and second switching elements being made conductive in accordance with a control signal to electrically connect said pair of data lines with each other;

a supplying circuit connected to said specific potential supplying node, supplying a precharge potential to said specific potential supplying node until said first and second switching elements are turned on, and supplying an equalizing potential to said specific potential supplying node after said first and second switching elements are turned on.

The first and second switching elements of said equalizing circuit may comprise MOS transistors having their gate electrodes connected to receive said control signal.

With the above arrangement, the precharge potential is applied to the specific potential supplying node at the time when the equalization begins, i.e., when the control signal changes from the inactive state to the active state. As the potential of the control signal line varies (from the inactive state toward the active state) one of the switching elements (first switching element) connected to one of the data lines is turned on. The precharge potential applied to the potential (VPL or VPH) is such a value which is closer than the equalizing potential to the potential of the data line of the above-mentioned one of the data lines. When the potential of the control signal becomes sufficient, the other switching element (second switching element) connected to the other data line is made conductive. It take less time for the potential of the control signal to become sufficient to turn on the second switching element because the specific potential supplying node is at the precharge potential which is closer to the above-mentioned one of the data lines, than if the specific potential supplying node is fixed at the equalizing potential. Thus, the two switching elements are made conductive in a shorter time, than if the specific potential supplying node is not isolated from the equalizing power supply circuit.

Assume that the switching elements are N-channel MOS transistors. As the potential of the control signal line rises (above a threshold of the MOS transistor) one of the MOS transistors (first MOS transistor) connected to one of the data lines which has transferred the signal of a lower potential level is made conductive. The MOS transistor (second MOS transistor) connected to the data line having a higher potential is made conductive when the potential of the control signal becomes sufficient. The potential sufficient to turn on the second MOS transistor is the sum of the threshold of the transistor and the potential of the specific potential supplying node, which is lower than if the specific potential supplying node is fixed at the equalizing potential, because the specific potential supply node is at the precharge potential VPL, which is lower than the equalizing potential. Accordingly, the MOS transistors are made conductive in a shorter time, than if the specific potential supplying node is not isolated from the equalizing power supply circuit.

DETAILED DESCRIPTION OF THE PREFERRED EMBODIMENTS

Figure 1:
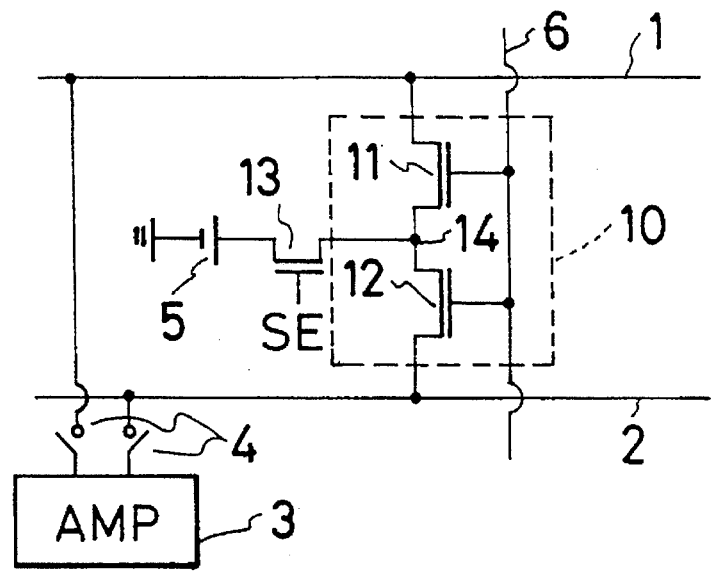
FIG. 1 is a circuit diagram showing a precharge and equalization circuit of Embodiment 1.
Figure 2:
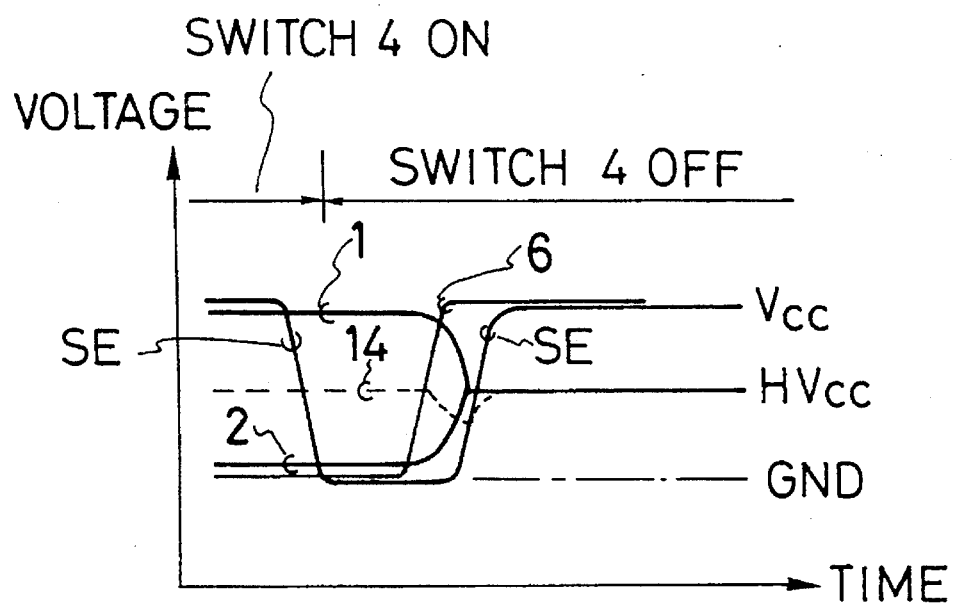
FIG. 2 is a waveform diagram showing the operation of the circuit of Embodiment 1.

Embodiments of the invention will now be described with reference to the drawings. In the various figures of the drawings, identical reference numerals denote identical or corresponding elements or components.

Embodiment 1

FIG. 1 is a circuit diagram of a precharge and equalization circuit of a first embodiment (hereinafter called Embodiment 1) of the present invention.

The precharge and equalization circuit of Embodiment 1 comprises an equalizing circuit 10, which is disposed between a pair of data lines 1 and 2 connected to an amplifier 3, such as a sense amplifier, via switches 4. The equalizing circuit 10 comprises a pair of switching elements, in the form of N-channel MOS transistors 11 and 12 having their drains connected to the data lines 1 and 2, respectively, their sources both connected to a specific potential supplying node 14, and their gates connected to a control signal line 6.

The precharge and equalization circuit further comprises a power transmitting circuit which is formed of an N-channel MOS transistor 13 having a gate connected to a second control signal SE. The drain of the transistor 13 is connected to the specific potential supplying node 14, and the source of the transistor 13 is connected to an equalizing potential power supply circuit 5 supplying an equalizing potential HVcc (Vcc/2).

The second control signal SE makes the MOS transistor 13 non-conductive while the control signal 6 changes from the inactive state to the active state, and making the MOS transistor 13 conductive after the first and second switching elements 11 and 12 are made conductive.

The data lines 1 and 2 are driven by the amplifier 3 via the switches 4 to transfer complementary information (Vcc level or the GND (ground) level).

For reading data from a memory cell not shown, the switch 4 is turned on to drive the pair of data lines 1 and 2 by means of the amplifier 3 for the purpose of information transfer. They are assumed to be set at the Vcc level and the GND level, respectively. The control line 6 is at the Low level (GND level), so that the transistors 11 and 12 are off, and the control signal SE is at the High level, and the transistor 13 is on, and the potential of a node 14, which is the specific potential supplying node, is at HVcc. After the information transfer is completed, the switches 4 are turned off to isolate the amplifier 3 from the data lines 1 and 2, and the control signal SE is brought to the Low level to turn off the transistor 13, and the potential of the control line 6 is raised to the High level to commence the equalizing operation, in preparation for the next cycle of data transfer operation. When the potential of the control line 6 exceeds the threshold potential Vth of the transistor 12, the transistor 12 is turned on, and the potential level of the node 14 is lowered. This is because the node 14 is isolated from the power supply circuit 5, and the parasitic capacitance of the node 14 is small compared with the data line 2 at the GND level, so that the charge is drawn from the node 14. Because of the lowering of the potential level of the node 14, the gate voltage of the transistor 11 becomes sufficient, i.e., exceeds the threshold, also denoted by Vth, of the MOS transistor 11, and the transistor 11 is turned on. As a result, the potential level of the data line 1 is lowered. Thereafter, the control signal SE is raised to the High level at a predetermined timing, the node 14 is connected to the power supply circuit 5, to equalize the potentials of the data lines 1 and 2 to HVcc.

Because the potential of the node 14 is lowered before the transistor 11 turns on, it takes less time for the MOS transistor 11 to turn on, than if the potential of the node 14 is fixed at the equalizing potential HVcc. If the potential of the node 14 is fixed at HVcc, the MOS transistor 11 is not turned on until the potential on the control line 6 exceeds HVcc + Vth (Vth being the threshold of the MOS transistor 11). Accordingly, the MOS transistors 11 and 12 are turned on in a shorter time than if the node 14 is not isolated from the equalizing potential power supply circuit 5. The pair of data lines are quickly equalized by means of a relatively simple configuration. Moreover, the number of transistors connected to the control line 6 is two per pair of data lines, so that delay in the rise of the data lines due to the parasitism of gate capacitances can be avoided. Furthermore, increase in the power consumption in the equalizing circuit is small.

Embodiment 2

Figure 3:
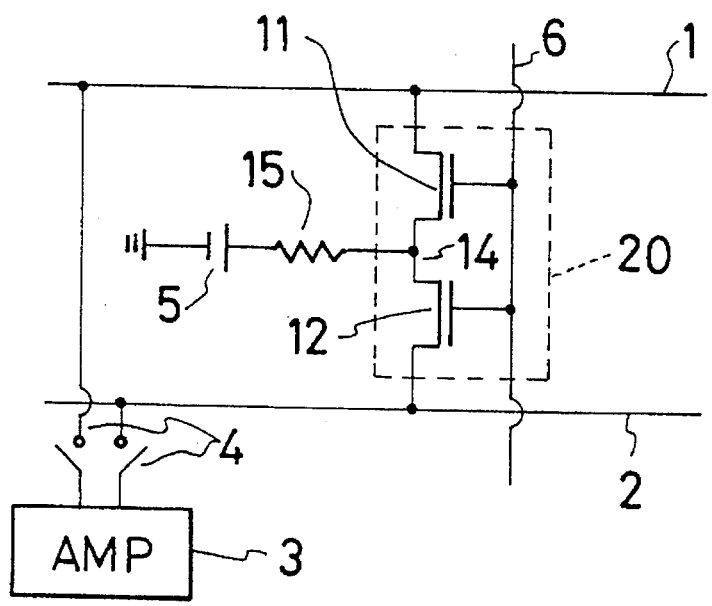
FIG. 3 is a circuit diagram showing a precharge and equalization circuit of Embodiment 2.

FIG. 3 is a circuit diagram of a precharge and equalization circuit of a second embodiment (Embodiment 2). The precharge and equalization circuit of Embodiment 2 comprises an equalizing circuit 10 which is identical to the equalizing circuit 10 of Embodiment 1. In place of the transistor 13, a resistance element formed of a resistor 15 is provided. The sources of the transistors 11 and 12 are both connected to one end of the resistor 15, and the other end of the resistor 15 is connected to the power supply circuit 5 supplying the equalizing potential HVcc. The data lines 1 and 2 are driven by the amplifier 3 via the switches 4 to transfer information, like Embodiment 1.

The operation of Embodiment 2 is similar to the operation of Embodiment 1. For instance, for reading data from a memory cell not shown, the switches 4 are on, and, for the purpose of information transfer, the data lines are driven by means of the amplifier 3 and set, for example, to the Vcc level and the GND level, respectively. The control line 6 is at the Low level (GND level), so that the transistors 11 and 12 are off, and the potential of the node 14, is set to the potential of the power supply circuit 5 via the resistance element 15. After the information transfer is completed, the switches 4 are turned off to isolate the amplifier 3 from the data lines 1 and 2, and the potential of the control line 6 is raised to the High level to commence the equalizing operation, in preparation for the next cycle of data transfer operation. When the potential of the control line 6 exceeds the threshold potential Vth of the transistor 12, the transistor 12 is turned on, and the potential level of the node 14 is lowered, because the parasitic capacitance of the node 14 is small compared with the data line 2 at the GND level, and the charge is drawn from the node 14. Because of the lowering of the potential level of the node 14, the gate voltage of the transistor 11 becomes adequate, and the transistor 11 is turned on, before the potential on the control line 6 exceeds HVcc + Vth, to lower the potential level of the data line 1. Thereafter, the potential on the node 14 is brought to HVcc, being delayed by the resistance element 15, and the potentials of the data lines 1 and 2 are equalized to HVcc. Embodiment 2 has the advantage, in addition to those of Embodiment 1, that the control with the control signal SE is not necessary.

Embodiment 3

Figure 4:
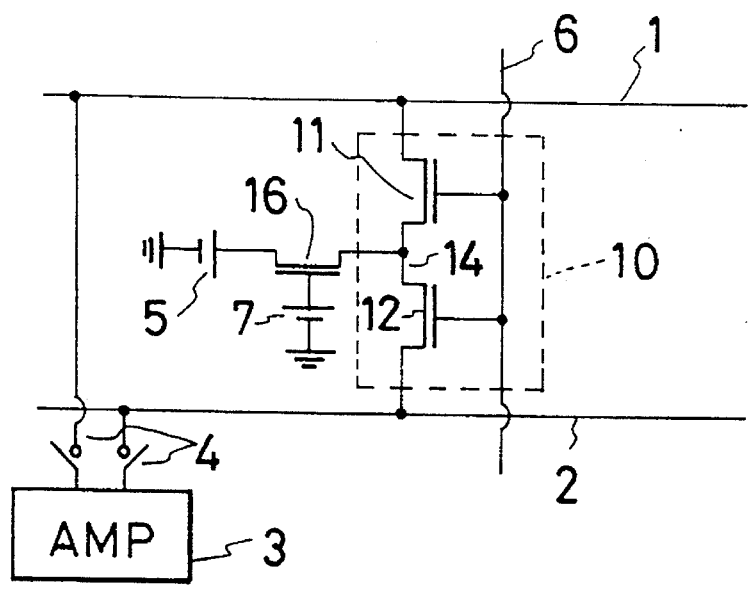
FIG. 4 is a circuit diagram showing a precharge and equalization circuit of Embodiment 3.

FIG. 4 is a circuit diagram of a precharge and equalization circuit of a third embodiment (Embodiment 3). The precharge and equalization circuit of Embodiment 3 comprises an equalizing circuit 10 which is identical to the equalizing circuit 10 of Embodiment 2. In place of the resistor 15 of Embodiment 2, an N-channel MOS transistor 16 is provided. The gate of the transistor 16 is connected to a power supply 7 of a fixed potential Vp. The sources of the transistors 11 and 12 are connected to the drain of the transistor 16, and the source of the transistor 16 is connected to the power supply circuit 5 supplying the equalizing potential HVcc. The data lines 1 and 2 are driven by the amplifier 3 via the switches 4 to transfer information, like Embodiments 1 and 2. In Embodiment 3, the fixed potential Vp is applied to the gate of the transistor 16, so that the transistor 16 is at all times on and is operating in the triode region, and the transistor 16 serves as a resistance element. In other words, the transistor 16 is equivalent to a resistor between the node 14 and the power supply circuit 5. Accordingly, the operation identical to that of Embodiment 2 can be realized.

By adjusting the potential Vp supplied to the gate of the transistor 16, the level of the node 14 can be controlled, so that the equalizing operation can be optimized.

Embodiment 4

Figure 5:
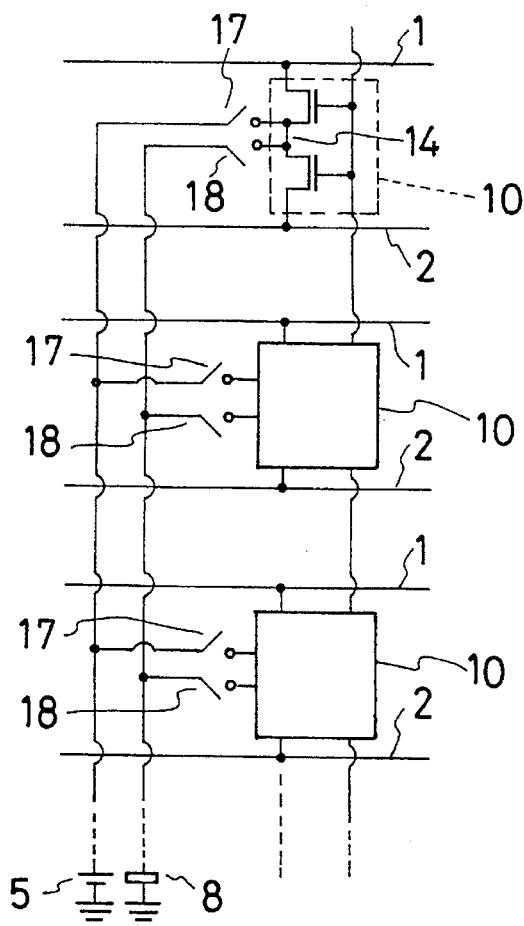
FIG. 5 is a circuit diagram showing a precharge and equalization circuit of Embodiment 4.

FIG. 5 is a circuit diagram of a precharge and equalization circuit of a fourth embodiment (Embodiment 4). The precharge and equalization circuit of Embodiment 4 comprises a plurality equalizing circuits, all denoted by 10. The equalizing circuits 10 are provided between respective pairs of data lines, all denoted by 1 and 2.

Each of the equalizing circuits 10 is disposed between the corresponding pair of data lines 1 and 2, which are connected to an amplifier, such as a sense amplifier, not shown via switches, in the same way as in FIG. 1, 3 or 4. The equalizing circuit 10 comprises first and second switching elements, in the form of N-channel MOS transistors 11 and 12 having their drains connected to the data lines 1 and 2, respectively, their sources connected together at the specific potential node 14, and their gates connected to a common control line 6. The precharge and equalization circuit further comprises third and fourth switching elements 17 and 18 connected to the respective equalization circuits, and are disposed between the corresponding pair of data lines 1 and 2. First terminals of the switching elements 17 and 18 are connected to the node 14. A second terminal of the switching element 17 is connected to the power supply circuit 5 supplying the equalizing potential HVcc (Vcc/2). A second terminal of the switching element 18 is connected to a second, or precharge potential power supply circuit 8 supplying a precharge potential VPL. The potential VPL is set be lower than HVcc and is higher than ground potential (GND).

The power supply circuits 5 and 8 are provided in common for a plurality of equalizing circuits, and connected to the plurality of the third and fourth switches 17 and 18 for the respective equalizing circuits 10.

The switching elements 17 and 18 may be formed of transistors, such as N-channel MOS transistors. In such a case, the second control signals are applied to the gates of the transistors; to control their conduction and non-conduction.

Figure 6:
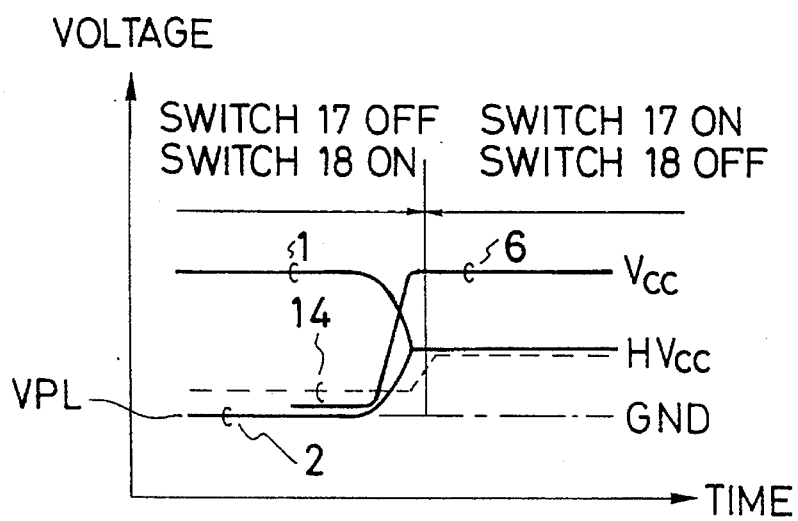
FIG. 6 is a waveform diagram showing the operation the circuit of Embodiment 4.

The operation of this embodiment will next be described with reference to FIG. 6. First, the pair of data lines 1 and 2 are driven by an amplifier, such as a sense amplifier, not shown, for the purpose of information transfer, and respectively set at the Vcc level and the GND level. The control line 6 is at the Low (GND) level. Accordingly, the transistors 11 and 12 are off. The switching element 18 is on, and the switching element 17 is off. The potential of the node 14 is at VPL.

When information transfer is completed, the amplifier, such as a sense amplifier, not shown, is isolated from the pair of data lines, and the potential level of the control line 6 is raised to the High level, to commence the equalizing operation in preparation for the next cycle of data transfer operation. That is, when the control line 6 exceeds the threshold potential Vth of the transistor 12, the transistor 12 is turned on, to raise the potential level of the data line 6. At the same time, the node 14 is at the precharge potential VPL, lower than the equalizing potential HVcc, so that when the potential level of the control line 6 exceeds VPL +Vth, (Vth being the threshold of the transistor 11,) the transistor 11 is turned on and the level of the data line 1 is lowered. After that, at a predetermined timing, the switching element 18 is turned off, and the switching element 17 is turned on, to equalize the pair of data lines to the potential HVcc.

In this embodiment, before the commencement of the equalizing operation, the node 14 is set at a potential VPL lower than the equalizing potential, and the on-resistances of the transistors 11 and 12 at the time of commencement of the equalization are made equal to each other. Accordingly, the operation is quicker than in the case of Embodiment 1 to Embodiment 3 in which the MOS transistor connected to the data line having the GND potential is turned on, to lower the node 14.

Moreover, it is desirable that the second power supply circuit 8 has a larger driving capability than the first potential power supply circuit 5 to quickly precharge the node 14, and thereby expedite the conduction of the switching elements 11 and 12.

In addition, the power consumption can be reduced. Furthermore, since the equalizing circuit is formed of an N-channel transistors, the area occupied by the device as a whole can be reduced.

Figure 7:
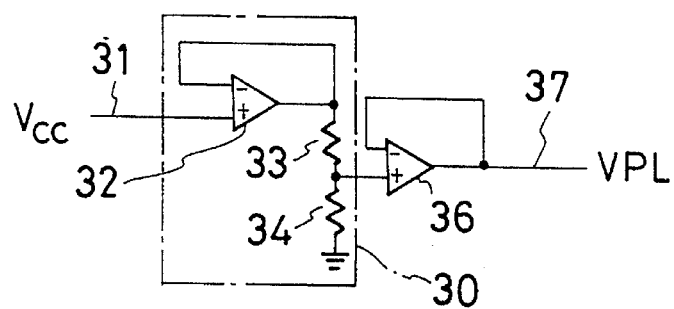
FIG. 7 is a circuit diagram of a VPL potential generating means of Embodiment 4.

The precharge potential power supply circuit 8 may be formed as shown in FIG. 7. The illustrated power supply circuit 8 provides a potential VPL lower than the equalizing potential HVcc and higher than the ground potential (GND). This power supply circuit 8 comprises two comparators 32 and 33, and resistance elements 33 and 34. The positive terminal of the comparator 32 is connected to a signal line 31 for supplying the potential Vcc, and the negative terminal of the comparator 32 is connected to one end of the resistance element 33, and the output of the comparator 32. The other end of the resistance element 33 is connected to one end of the resistance element 34 and the positive terminal of the comparator 36, and the other end of the resistance element 34 is connected to the ground. The negative terminal of the comparator 36 is connected to the output signal line 37 of the comparator 36. The output of the comparator 36, at its output signal line 37 provides the potential VPL.

Embodiment 5

Figure 8:
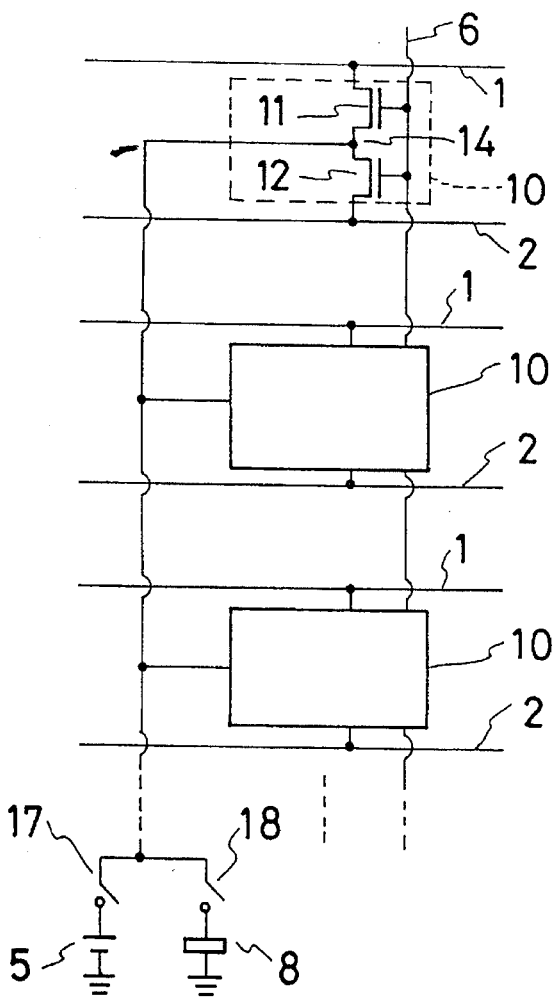
FIG. 8 is a circuit diagram showing a precharge and equalization circuit of Embodiment 5.

FIG. 8 shows another embodiment (Embodiment 5). This embodiment is similar to Embodiment 4, but the switching elements 17 and 18 are nor provided for the respective equalizing circuits 10, but are provided in common for a plurality of equalizing circuits 10, and away from the data lines 1 and 2 and the equalizing circuits 10. Specifically, first terminals of the switching elements 17 and 18 are connected to the nodes 14 of a plurality of equalizing circuits 10. A second terminal of the switching element 17 is connected to the power supply circuit 5, and a second terminal of the switching element 18 is connected to the power supply circuit 8. Thus, the switching element 17 connects, when conductive, the power supply circuit 5 with the nodes 14 of a plurality of equalizing circuits 10. The switching element 18 connects, when conductive, the power supply circuit 8 with thee nodes 14 of a plurality of equalizing circuits 10.

The switching elements 17 and 18 are controlled, in the same way as the switching elements 17 and 18 in Embodiment 4. The operation of the circuit of Embodiment 5 is therefore similar to the operation of the circuit of Embodiment 4.

An additional advantage of this embodiment is that the number of the switching elements and the number of the wiring conductors of the equalizing circuits can be reduced, and the area occupied by the device as a whole can be reduced.

Embodiment 6

Figure 9:
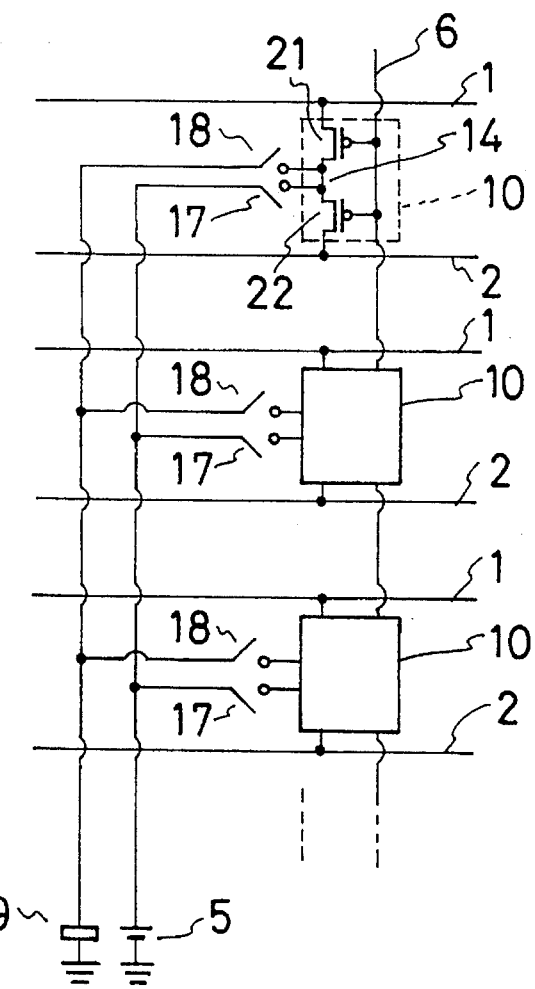
FIG. 9 is a circuit diagram showing a precharge and equalization circuit of Embodiment 6.
Figure 10:
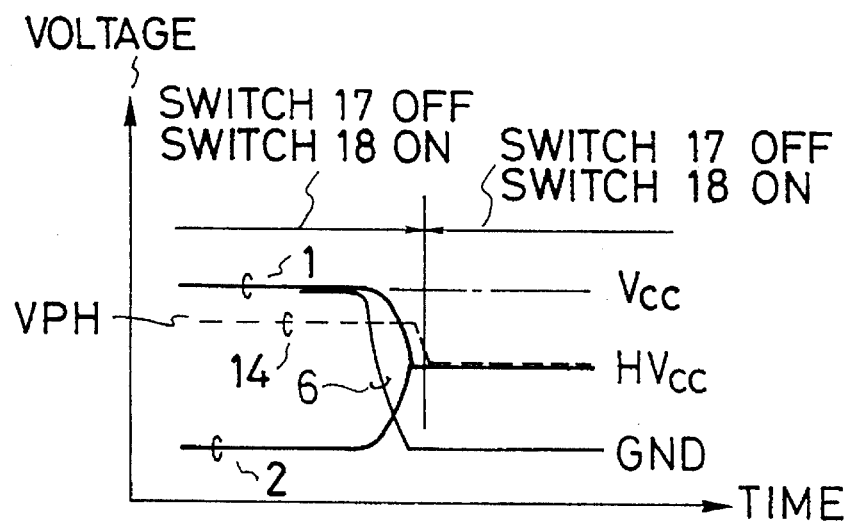
FIG. 10 is a waveform diagram showing the operation of the circuit of Embodiment 6.

FIG. 9 shows another embodiment (Embodiment 6). FIG. 10 is a waveform diagram showing the operation of the equalizing circuit of FIG. 9. This embodiment is similar to Embodiment 6, but the switching elements forming each equalizing circuit 10 comprise P-channel MOS transistors 21 and 22. The gates of the P-channel MOS transistors 21 and 22 are connected to a common control line 6, the potential on which is lowered to the ground when the transistors 21 and 22 are to be made conductive.

In place of the power supply circuit 8 of Embodiment 4, a power supply circuit 9 is provided. The power supply circuit 9 provides a potential VPH which is higher than HVcc and lower than Vcc.

The operation will next be described with reference to FIG. 10. First, for the purpose reading operation, the pair of data lines 1 and 2 are driven by an amplifier, such as a sense amplifier, not shown, for the purpose of information transfer, and respectively set at the Vcc level and the GND level. The control line 6 is at the High (Vcc) level. Accordingly, the transistors 21 and 22 are off. The switching element 18 is on, and the switching element 17 is off. The potential of the node 14 is therefore at VPH. When information transfer is completed, the amplifier, such as a sense amplifier, not shown, and is isolated from the pair of data lines, and the control line 6 is lowered to the Low level, to commence the equalizing operation, in preparation for the next cycle of data transfer operation. That is, when the control line 6 falls below Vcc–Vtp (Vtp being the threshold of the transistor 21), the transistor 21 is turned on, to lower the potential level of the data line 1. At the same time, the node 14 is at the precharge potential VPH, higher than the equalizing potential HVcc, so that when the control line 6 falls below VPH–Vtp, (Vtp being the threshold of the transistor 22) the transistor 22) is turned on and the level of the data line 2 is raised. After that, at a predetermined timing, the switching element 18 is turned off, and the switching element 17 is turned on, to equalize the pair of data lines 1 and 2 to the potential HVcc.

This configuration replaces the MOS transistors contained in each equalizing circuit of FIG. 5 with P-channel MOS transistors, and yet realizes similar operations. In this embodiment, like FIG. 5, (although the equalizing circuit of FIG. 5 uses a low VPL), before the commencement of the equalizing operation, the circuit is in a stand-by state, in which the node 14 is set at a potential VPH higher than the equalizing potential, and high-speed equalization is achieved, by having the on-resistances of the transistors 21 and 22 at the time of commencement equal to each other. Moreover, since the equalizing circuits are formed of P-channel MOS transistors, if the equalizing potential is set near Vcc to eliminate the effects of noises of the GND level, equalization of an even higher speed can be achieved.

Embodiment 7

Figure 11:
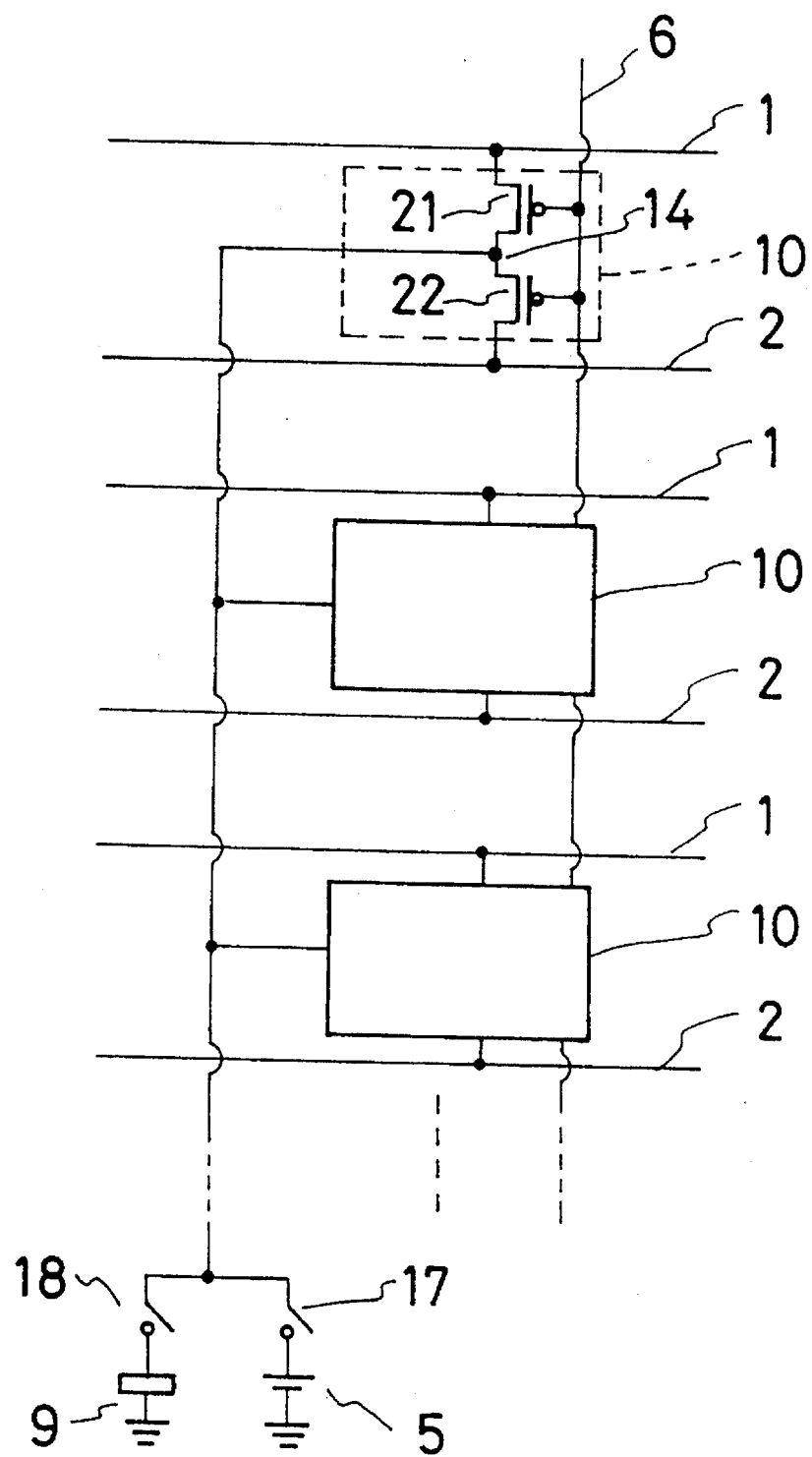
FIG. 11 is a circuit diagram showing a precharge and equalization circuit of Embodiment 7.

FIG. 11 shows another embodiment (Embodiment 7). This embodiment is similar to Embodiment 6, but the switching elements 17 and 18 are provided in common for a plurality of equalizing circuits 10, and away from the data lines 1 and 2, and the equalizing circuits 10. Specifically, first terminals of the switching elements 17 and 18 are connected to the nodes 14 of a plurality of equalizing circuits 10. A second terminal of the switching element 17 is connected to the power supply circuit 5, and a second terminal of the switching element 18 is connected to the power supply circuit 9. Thus, the switching element 17 connects, when conductive, the power supply circuit 5 with the nodes 14 of a plurality of equalizing circuits 10. The switching element 18 connects, when conductive, the power supply circuit 8 with the nodes 14 of a plurality of equalizing circuits 10.

The switching elements 17 and 18 are controlled, in the same way as the switching elements 17 and 18 in Embodiment 6. The operation of the circuit of Embodiment 7 is therefore similar to the operation of the circuit of Embodiment 6.

An additional advantage of this embodiment is that the number of the switching elements and the number of the wiring conductors of the equalizing circuits can be reduced, and the area occupied by the device as a whole can be reduced.

Modifications

The invention is not limited to the embodiments described above. The switching elements may be all formed of transistors. If the transistors are all of the same channel type, fabrication of the device is simpler.

The inventive concept described in connection with Embodiments 1 to 3 can also be applied to a situation where the switching elements of the equalizing circuit are formed of P-channel MOS transistors. In such a case, the control signal is at a high level when it is in an active state, and is at a low level when it is in an inactive state. As the potential of the control signal line is lowered (below a threshold of the MOS transistor) one of the MOS transistors (first MOS transistor) connected to one of the data lines which has transferred the signal of a higher potential level is made conductive, so that the potential of the specific potential supplying node is raised. Because of the potential increase in the specific potential supplying node, the MOS transistor (second MOS transistor) connected to the data line having a lower potential is made conductive when the potential of the control signal becomes sufficiently low. The potential sufficiently low to turn on the second MOS transistor is the sum of the threshold of the transistor and the potential of the specific potential supplying node, which is higher than if the specific potential supplying node is fixed at the equalizing potential. Accordingly, the MOS transistors are made conductive in a shorter time, than if the specific potential supplying node iS not isolated from the equalizing power supply circuit.

What is claimed is:

1. A semiconductor memory device comprising:

a pair of data lines for transferring complementary signals;

an equalizing circuit having a first switching element connected between one of said pair of data lines and a node, and a second switching element connected between the other of said pair of data lines and the node, said first and second switching elements being made conductive in accordance with a first control signal to electrically connect said pair of data lines with each other:

a power transmitting circuit connecting said node with a supply circuit of an equalizing potential; and a sense amplifier selectively connected to said pair of data lines.

2. The semiconductor memory device as set forth in claim 1 wherein said sense amplifier connects to said pair of data lines when said first and second switching elements are made nonconductive.

3. The semiconductor memory device as set forth in claim 1 wherein said power transmitting circuit connects said node with said supply circuit after said first and second switching elements are made conductive.

4. The semiconductive memory device as set forth in claim 1, wherein said first control signal is in an active state to make the first and second Switching elements conductive, and in an inactive state to make the first and second switching elements nonconductive;

said power transmitting circuit comprises a MOS transistor having a first electrode connected to said node, a second electrode connected to said supply circuit, and a gate electrode to which a second control signal is applied; and said second control signal makes said MOS transistor nonconductive while said first control signal changes from the inactive state to the active state, and makes said MOS transistor conductive after said first and second switching elements are made conductive.

5. The semiconductor memory device as set forth in claim 1 wherein said power transmitting circuit comprises a resistance element having a first end connected to said node, and a second end connected to said supply circuit.

6. The semiconductor memory device as set forth in claim 1 wherein said resistance element comprises a MOS transistor having a first electrode connected to said node, a second electrode connected to said power supply circuit, and a gate electrode connected to such a fixed potential that it operates in the triode region.

7. The semiconductor memory device as set forth in claim 1 wherein said first and second switching elements of said equalizing circuit comprises MOS transistors having their gate electrodes connected to receive said first control signal.

8. The semiconductor memory device as set forth in claim 1, wherein said equalizing potential is half the Vcc level.

* * * * *